(12) United States Patent
Kumamoto

(10) Patent No.: US 6,451,689 B1
(45) Date of Patent: Sep. 17, 2002

(54) METHOD FOR MANUFACTURING SEMICONDUCTOR DEVICE

(75) Inventor: Nobuhisa Kumamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/691,037

(22) Filed: Oct. 19, 2000

(30) Foreign Application Priority Data

Oct. 20, 1999 (JP) .......................................... 11-298590
Oct. 20, 1999 (JP) .......................................... 11-298591
Oct. 20, 1999 (JP) .......................................... 11-298592

(51) Int. Cl.⁷ ......................................... H01L 21/4763
(52) U.S. Cl. ...................... 438/643; 438/629; 438/643; 438/650; 438/653; 438/670; 438/678; 438/687
(58) Field of Search ................................ 438/639, 629, 438/678, 687, 637, 642, 643, 650, 652, 653, 669, 670, 686

(56) References Cited

U.S. PATENT DOCUMENTS 4,388,351 A * 6/1983 Sawyer ........................ 427/304
6,197,688 B1 * 3/2001 Simpson ..................... 438/678

FOREIGN PATENT DOCUMENTS

JP          405037172 A    *  2/1993
JP          409307234 A    * 11/1997

* cited by examiner

Primary Examiner—Carl Whitehead, Jr.
Assistant Examiner—Khanh B. Duong
(74) Attorney, Agent, or Firm—Arent Fox Kintner Plotkin & Kahn, PLLC

(57) ABSTRACT

In the case of providing a contact hole (2a) in an insulting film (2) on the substrate (1), and forming a wiring on the insulting film to be connected to an exposed portion by the contact hole, a tin film (4) is formed on a location where the wiring is formed, and a paradium film (5) is formed on a location where the wiring is formed by immersing a portion where the tin film is provided in a solution containing a paradium ion ($Pd^{2+}$). Then, the paradium film is used as a reaction start layer to form a copper film (6) by the electroless plating method. Furthermore, a second copper film may be formed by the electroplating by using the copper film as the feeder layer. By doing so, there is provided a semiconductor device wherein the diffusion of elements of the reaction start layer (the seed layer) into the film is prevented, a copper film having a small specific resistance and excellent conductivity formed with good reliability, and a higher integration can be provided with further fine wiring.

6 Claims, 3 Drawing Sheets

METHOD FOR MANUFACTURING SEMICONDUCTOR DEVICE

FIELD OF THE INVENTION

The present invention relates to a method for manufacturing a semiconductor device such as a semiconductor integrated circuit (IC) and an LSI or the like in which a fine wiring is formed. More particularly, the invention relates to a method for manufacturing a semiconductor device in which a copper film which can suppress wiring resistance to a small level according to miniaturization can be efficiently formed with close contact characteristic, in a predetermined pattern and with a low resistance.

BACKGROUND OF THE INVENTION

Along with a higher integration of the semiconductor device in recent years, demand is made on an extremely thin and fine wiring. Using a copper film having a small resistance is considered in the place of a conventional Al as a wiring for the semiconductor device. However, since it is difficult to etch copper, it is difficult to form the copper film by covering the entire surface by a sputtering method and patterning the surface thereof. Consequently, it is thought to form the copper film either by an electroless plating method or an electroplating method as a method for forming such copper film.

However, in the electroless plating method, a reaction start layer comprising paradium or the like is required wherein a copper ion starts reaction. However, when a paradium layer or the like is provided by the sputtering method, the thickness of the layer becomes thick. When a copper film is formed by the electroless plating method, metal such as paradium or the like constituting the reaction start layer is diffused in large quantity in this copper film at the time of forming the copper film. The reaction start layer formed of paradium or the like has a larger specific resistance than copper, and raises the electric resistivity of this copper film with the diffused paradium or the like even if a copper film is used which has a small resistivity. Consequently, there is a problem in that an increase in the integration is restricted because a decrease in the resistance of the wiring film which is to be made fine cannot be sufficiently satisfied, and the wiring cannot be made thin.

Furthermore, for example, Japanese Unexamined Patent Publication No. HEI 7-321111 discloses a method for forming a wiring for a semiconductor device by the electroless plating comprising: forming a zinc oxide layer; electrifying the zinc oxide layer by electroless plating in a solution in which metal having smaller ionization tendency than the zinc oxide, for example, paradium is dissolved; and forming a wiring such as copper or the like on the upper surface thereof. However, in these cases, the film cannot be patterned after the copper film is formed. The film should be patterned in the state of the reaction start layer, and a certain degree of thickness is required to etch the reaction layer with good precision. There is a problem in that when the reaction start layer becomes thick, an increase in the specific resistance by the dispersion(diffusion) of paradium into the copper film cannot be prevented sufficiently in a similar manner as the sputtering method as described above, and oxygen remains in the zinc oxide film layer to increase a contact resistance.

On the other hand, in the case where a copper film is formed on an insulting film by using an electric plating method, a feeding layer becomes necessary for electrification. In such a case, when wiring is formed of copper or the like, copper passes through the insulation layer and is diffused into the semiconductor layer thereby exerting an unfavorable influence upon the operation of the semiconductor device. Thus it is thought that a barrier metal layer is provided as a base layer of the wiring. As this barrier layer, generally metal layers such as Ti, TiN or the like is used. Then, the metal layer is formed in a predetermined pattern by forming the film by the sputtering method, the CDV method or the like to pattern the film. Thus, it is thought that copper is subjected to the electroplating by using this barrier layer as a feeder layer.

As described above, in order to lower an electric resistance of wiring along with miniaturization, wiring by a copper film having a small specific resistance is considered. In the electroless plating method, there is a problem in that the constituent element of the reaction start layer is diffused in the copper film, and at the same time, the electric resistance of the wiring is increased as well as the film quality is not fine, and, in addition, it takes a long time to form the film. There is also a problem in that even if an attempt is made to form the film by the electric plating method, the specific resistance of the barrier layer which is considered as a feeder layer is large, and the electric resistance becomes large in fine wiring which has been miniaturized, and at the same time, the metal of the barrier layer and copper has an unfavorable contact characteristic, so that a copper film cannot be sufficiently formed. In particular, there is also a problem in that electricity is not sufficiently supplied on the end portion side such as a contact hole or the like distant from the feeding side because of the resistance of the barrier metal layer, film formation becomes insufficient, and the thickness of the copper film is irregular depending upon locations thereof.

Furthermore, in this kind of highly integrated semiconductor device, there is a case in which a wiring groove is formed by means of etching of the wiring pattern portion in order to prevent the rise of the wiring to planarize the device and the wiring is formed in the groove. In such a method, a patterning process is required for forming a wiring groove in the insulting film. Furthermore, a patterning of the wiring is required, and a margin for a shift in both masks is required. Consequently, there is a problem in that the miniaturization of the wiring is prevented, and the patterning must be conducted separately with the result that the number of process increases and the cost comes too high.

SUMMARY OF THE INVENTION

An object of the present invention is to provide a method for manufacturing a semiconductor device wherein the diffusion of an element constituting a reaction layer into a copper film is prevented by providing the reaction start layer which serves as a seed layer while a copper film is formed by a electroless plating in the case of forming a copper film wiring, and a copper film wiring is formed which has a small resistance and an excellent conductivity with good reliability, and a higher integration can be accomplished by further miniaturization of the wiring.

Another object of the present invention is to provide a method for manufacturing a semiconductor device wherein a wiring is formed of a fine copper film having a small electric resistance with good reliability in a short time in the case of forming the wiring in the process of forming the wiring, and a higher integration can be accomplished by the miniaturization of the wiring.

Still another object of the present invention is to provide a method for enabling to effectively form a reaction layer that functions as a base on forming copper film by electroplating.

Still another object of the present invention is to provide a method for manufacturing a semiconductor, the method being capable of accurately forming a fine pattern without generating a problem of a shift in the mask by decreasing the number of processes and attaining a higher integration. Furthermore, the simplification of the process and the diffusion of metal of the reaction start layer into a copper film is prevented, a copper film having a small resistance and an excellent conductivity is formed with good reliability, and still higher integration can be attained with the miniaturization of one layer of the wiring.

The method for manufacturing a semiconductor according to the present invention wherein a contact hole is provided on an insulting film on a substrate to be connected to an exposed portion by the contact hole, and a wiring is formed on the insulting film, the method comprising the steps of:

forming a tin film on a location where the wiring is formed;

forming a paradium film on the surface of the tin film by immersing the location where the tin film is formed in a solution containing a paradium ion; and forming a copper film by the electroless plating method by using the paradium film as a reaction start layer.

In this method, as the reaction start layer for subjecting copper to an electroless plating, a paradium layer is formed. This paradium layer is provided in place of tin on the surface of the tin film provided in advance, so that the film is formed as an extremely thin film. As a consequence, even when the copper film is formed on the surface by the electroless plating, paradium is scarcely diffused in the formation of the copper film, so that a copper film having a low resistance can be formed.

It is preferable that the tin film is formed on a location where the wiring is formed by immersing the location in a solution containing a tin ion ($Sn^{2+}$) so that tin is adsorbed thereon because the tin film is formed as a thin layer close to a mono-layer(mono molecular or atomic layer) on the location where the wiring is formed.

Furthermore, it is preferable that the paradium film is formed in a mono-layer because the film can serve as a seed of the electroless plating of copper, the quantity thereof is small and the diffusion of paradium into the copper film can be prevented in the formation process.

Another form of the method for manufacturing the semiconductor device according to the present invention provides a method wherein a contact hole is provided on an insulting film on a substrate to be connected to an exposed portion by the contact hole, and a wiring is formed on the insulting film, the method being characterized by forming a first copper film on a location where a wiring is by the electroless plating method and forming a second copper film on the first copper film by an electric plating(electroplating) method.

According to this method, since the first copper film has an extremely low resistance with a barrier metal layer or the like, the first copper film functions sufficiently as a feeder layer for electrification in a fine wiring pattern, copper is provided on a copper film by the electric plating, so that a good quality copper film can be formed with good contact characteristic with the base in a short time.

A tin film is formed at a location where the wiring is formed, and the portion where the tin film is formed is immersed in a solution containing a paradium ion ($Pd^{2+}$) with the result that a paradium film is formed on the location where the wiring is formed. Then the first copper film is formed by the electroless plating by using the paradium film as the reaction start layer, so that a thin paradium film can be formed, thereby making it possible to prevent an increase in the specific resistance by the diffusion of the paradium into the copper film.

Still another form of the method for manufacturing the semiconductor device provides a method in which a contact hole is provided on an insulting film on a substrate, a part of the insulting film of location where the wiring is formed is etched to form a groove for the wiring to be connected to an exposed portion by the contact hole, and a wiring is formed in the groove for wiring of the insulting film, the method being characterized by forming the contact hole and the groove for the wiring by providing and patterning a resist film on the insulting film, etching the resist film; forming a reaction start layer for electroless plating of copper on the entire surface of the film; retaining the reaction layer only on a location where the wiring is formed by removing the reaction start layer on the resist layer with the resist layer; and forming the copper film on the reaction start layer by the electroless plating method.

In this method, since the reaction start layer can be formed which serves as a base of the electroless plating by using the resist film for forming the groove of the wiring pattern on the insulting film as it is with the result that the reaction start layer can be formed in a small number of process and in good pattern precision without requiring a margin for a shift in the mask. Furthermore, since the copper film is provided by the electroless plating on the reaction start layer, the copper film is not formed on the portion without the reaction start layer, and the copper film can be formed accurately in the first patterning as it is.

When the reaction start layer is formed by forming a tin film, and forming a paradium film on the surface thereof by immersing the portion where the tin film is formed in a solution containing a paradium ion ($Pd^{2+}$), the paradium film is provided in replacement of paradium with tin on the surface of the tin film with the result that the paradium film can be formed as an extremely thin film. Consequently, even when the copper film is formed on the paradium film by the electroless plating, paradium is scarcely diffused in the copper film in the formation thereof, and a copper film having a low resistance can be formed.

Preferably, the tin film can be formed by immersing the substrate on which the contact hole and the groove for wiring are formed in a solution containing a tin ion ($Sn^2+$) to adsorb tin therein, so that the tin film can be easily formed in a thin layer close to a mono-layer at the location where the wiring is formed.

DETAILED DESCRIPTION OF THE INVENTION

Figure 1:
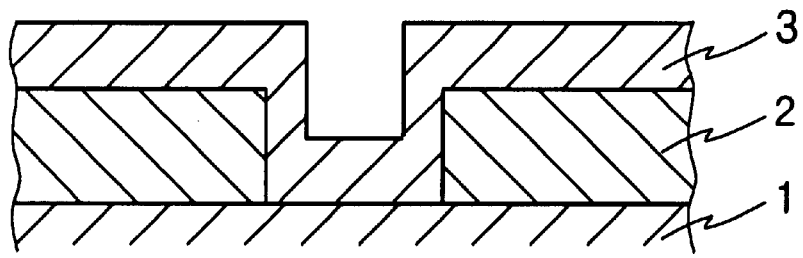
FIGS. 1(a) through 1(d) are views showing a process of forming a wiring, the view explaining one embodiment of the method for manufacturing a semiconductor device according to the present invention.
Figure 1:
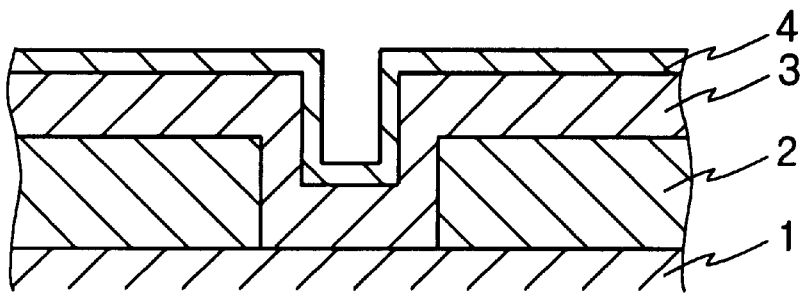
Figure 1:
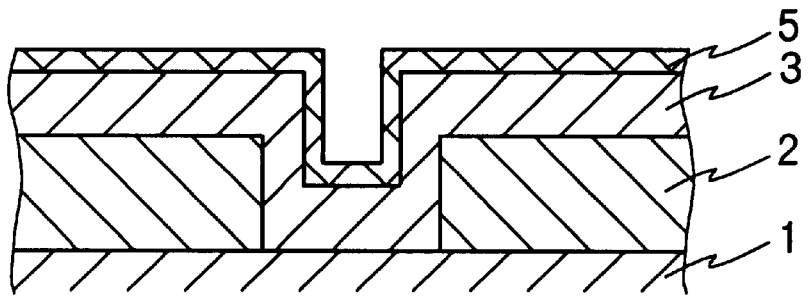
Figure 1:
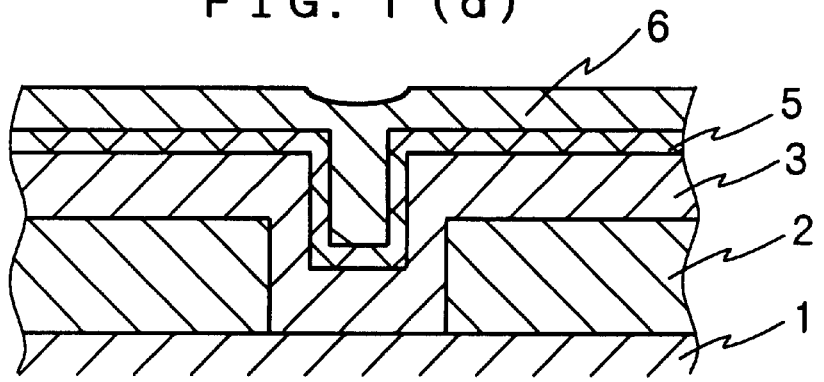

A method for manufacturing a semiconductor device according to the present invention is characterized in the formation of the wiring in the case of forming the wiring on an insulting film in order to connecting between elements and connecting between an element and an electrode pad. Consequently, the process of forming this wiring will be explained, but normal manufacturing method is adopted in various manners in the method for manufacturing other semiconductor elements such as transistors and the like.

First embodiment of the method for manufacturing the semiconductor device according to the present invention comprises: forming a barrier metal layer formed of, for example, TiN or the like, on an entire surface of a semiconductor substrate and an insulting film which are exposed by a contact hole 2a of the insulting film 2 provided on, for example, the semiconductor substrate 1, as shown in FIG. 1(a) in the beginning; and patterning the barrier metal layer to form a barrier metal layer 3 in accordance with a pattern of the wiring which is formed. Incidentally, this process is omitted when it is not necessary to provide the barrier metal layer.

As the semiconductor substrate 1, for example, a silicon substrate or the like is used. The conductivity type thereof is formed either in an n-type or a p-type depending upon the semiconductor element which is formed. Furthermore, as the insulting film 2, SiOx and SiNx are used depending upon the manufacturing process of the normal semiconductor devices. The barrier layer 3 is provided to prevent a mutual diffusion with the wiring and the semiconductor substrate 1. Except for the TiN described above, conductors such as Ti, Ta, TaN, IrO or the like are used. The barrier layer is formed into a predetermined pattern by depositing the barrier metal on the entire surface of the semiconductor substrate by the sputtering or the CVD method, followed by patterning the barrier metal layer to be formed into a predetermined pattern.

Next, as shown in FIG. 1(b), after for example, a resist film not shown is formed and the film is patterned for removing only the configuration portion of the wiring pattern, the semiconductor substrate 1 is immersed in a solution including tin ion ($Sn^{2+}$) and the resist film is removed with the result that a tin film 4 is formed as an extremely thin layer to a degree of a mono-layer only on the barrier metal layer 3 on which the wiring pattern will be formed. Alternatively, in place of the lift off method, the patterning may be conducted by etching the film in a later process.

As a solution including a tin ion ($Sn^{2+}$), for example, a aqueous solution such as tin chloride ($SnCl_2$) or the like can be used. Since $Sn^{2+}$ has a characteristic of being easily adsorbed as an Sn atom layer, $Sn^{2+}$ is particularly preferable because thin film such as Sn mono-layer (mono atom layer) can be formed easily with the adsorption action by immersing the layer in a solution including $Sn^{2+}$. However, the film may be formed by other methods such as the sputtering method or the like.

Next, tin and paradium is replaced and paradium is deposited through ion exchange reaction which is generated between tin and paradium ion by immersing the semiconductor substrate 1 on which this tin film 4 is formed in a solution containing the paradium ion ($Pd^{2+}$) with the result that as shown in FIG. 1(c), only Sn on the surface of the tin film 4 is replaced with Pd (in FIG. 1, the tin film 4 is thin, and the whole film is replaced), and the paradium film 5 is formed on the barrier layer 3. In this case, when the tin film 4 is formed in a mono-layer, a paradium film 5 of the mono-layer is formed as it is. Even when the tin film 4 is not formed in the mono-layer, a paradium film 5 can be formed which is extremely thin to such an extent that the thickness thereof is very close to the mono-layer of paradium by controlling the time in which the tin film is immersed in the solution including paradium ion ($Pd^{2+}$).

Next, a copper film 6 can be formed which serves as the wiring as shown in FIG. 1(d) by providing the electroless plating using a plating solution containing a copper ion while using this paradium film 5 as the reaction start layer.

As a plating solution containing the copper ion a copper fluoride solution can be used. Furthermore, as a reducing agent, aldehydes such as formaldehyde or the like are normally used in a preferable manner.

According to a method for manufacturing the semiconductor device according to the first embodiment of the invention, the reaction start layer (a seed layer) which is required in the case of subjecting copper to the electroless plating is formed of paradium film which is deposited by ion exchange reaction which occurs between tin and paradium ion. Consequently, the reaction start layer which is a paradium film can be extremely thin having a thickness to an extent on the order of a mono-layer and the copper film which is a wiring of the semiconductor device is formed by the electroless plating method, so that the diffusion of constituting elements of the reaction start layer into the copper film can be suppressed to a minimum level. As a result, even the wiring pattern extremely miniaturized along with the higher integration of the semiconductor device can be formed of a copper film having a small specific resistance, and a wiring having a small electric resistance can be formed.

It is preferable that when the paradium film is thinner, the film can more suppress the diffusion of the paradium into the copper film. Besides, it is more preferable that the paradium film is formed in a mono-layer. A thin layer of this paradium film can be formed by controlling the time of immersion in the $Pd^{2+}$ solution as described above. A thin layer of this paradium film can be formed by controlling the immersion time in the $Pd^{2+}$ solution as described above. A thin layer of paradium can be formed with certitude by forming the tin film to a thickness on the order of mono-layer. From that point of view, it is preferable that the tin film can be formed with a thin thickness on the order of a mono-layer with the characteristic of $Sn^{2+}$ by using the adsorption method in which the tin film is immersed in an $Sn^{2+}$ solution.

The embodiment described above is such that the tin film is formed as an extremely thin layer, and the whole film is formed in replacement with paradium. It is also possible to form a paradium mono-layer by replacing a part of the surface of the tin film with paradium. Furthermore, the embodiment described above is an example in which a wiring is formed which contacts the semiconductor layer. The same thing holds true of a wiring which contacts a lower layer wiring in the case where an upper wiring is formed on a lower wiring with the semiconductor device in which a multi-layer wiring is formed. In such a case, the barrier layer is not required once in a while.

According to the first embodiment, since it is possible to form a copper film wiring having an extremely small specific resistance, it is possible to form the wiring in the semiconductor device without increasing the resistance even when the extremely highly integrated, fine and thin wiring is demanded. The result thereof contributes toward higher integration of the semiconductor device and an increase in the multiplication of the layer of the wiring.

Figure 2A:
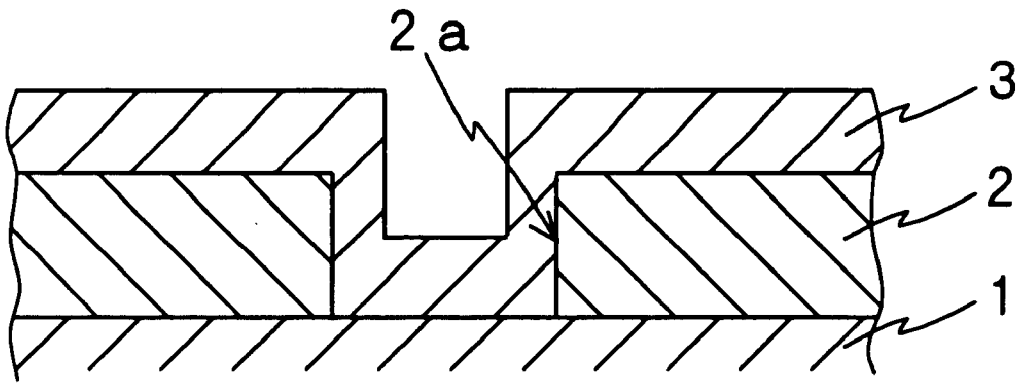
FIGS. 2(a) through 2(c) are views showing a process of forming a wiring, the view explaining another embodiment of the method for manufacturing a semiconductor device according to the present invention.

A second embodiment of the present invention is such that a copper wiring can be formed in a short time and in high density. Thus, in the beginning, as shown in FIG. 2(a), after a barrier metal made of, for example, TiN or the like is deposited on the entire surface of the insulting film 2 on the semiconductor substrate 1, and for example, the substrate 1 to be exposed by a contact hole 2a provided in the insulting film 2, a barrier metal layer 3 is formed by patterning in accordance with the patterning of the wiring to be formed. In this case, the process is omitted when it is not required to provide a barrier metal layer. With respect to the semiconductor substrate 1, the insulation layer 2 and the barrier metal layer 3, the same thing holds true like the example shown in FIG. 1.

Figure 2B:
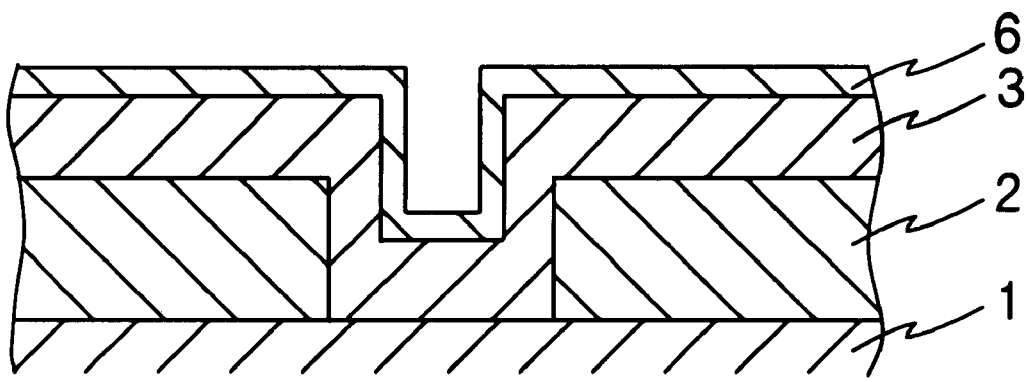

Next, as shown in FIG. 2(b), a first copper film 6 is formed on the barrier metal layer 3 by the electroless plating method by using a plating solution including a copper ion. Since it is difficult to directly form the first copper film 6 on the barrier metal layer 3, it is preferable that paradium film or the like is formed as a reaction start layer. In this case, preferably, the diffusion of elements into the copper film can be prevented in the same process as the embodiment shown in FIGS. 1(a) to 1(d).

As the plating solution containing the copper ion described above, a copper fluoride solution can be used. Besides, as a reducing agent, aldehydes such as formaldehyde or the like are normally used.

Figure 2C:
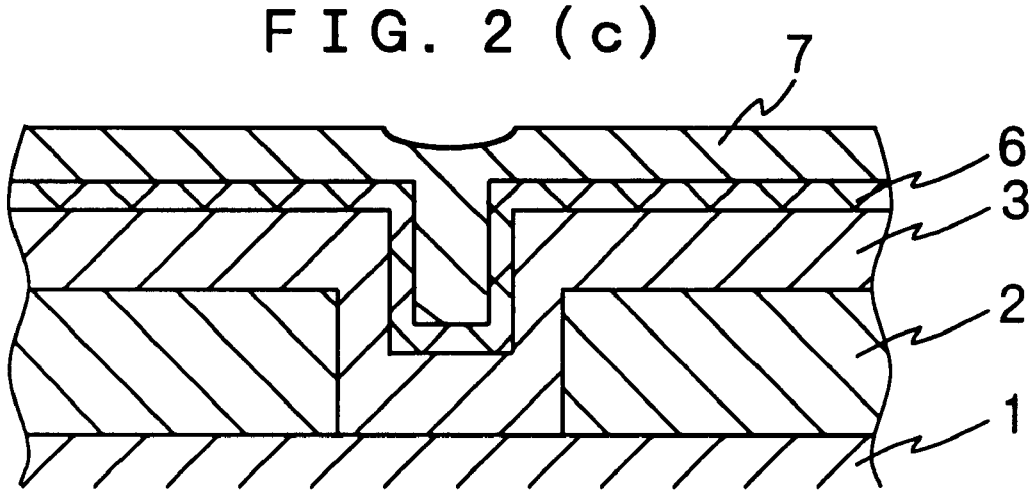

Next, a second copper film 7 is formed on the first copper film 6 as shown in FIG. 2(c) by immersing the film in the electrolytic solution containing a copper ion, electrifying between the first copper film being set as a negative electrode and the electrolytic solution being set as a positive electrode, and providing the electric plating. As a consequence, a wiring pattern by the second conductive (copper) film 7 having a thin width can be formed in accordance with the wiring pattern provided with the first copper film 6. As the electrolytic solution containing the copper ion, the copper fluoride solution or the like can be used.

In the method for manufacturing the semiconductor device according to the second embodiment of the invention, the copper film is formed by the electric plating method. Since the base is the first copper film 6 provided by the electroless plating method, the base is a copper lamination layer and has a good close contact characteristic. Besides, since the first copper film provided with the electroless plating method is used as the feeder layer; the electric resistance is small, and electric current can be sufficiently supplied to the end far from the power source, and the copper film can be formed in an even thickness without irregularity. As a consequence, a thick and good quality film can be formed in a shorter time than that of electroless plating method, and a wiring having a sufficiently small electric resistance can be formed. As a consequence, much more fine wiring pattern along with a higher integration of the semiconductor device can be formed with a copper film having a small specific resistance, with the result that a higher integration and a more fine wiring can be formed.

The electroless copper plating is particularly preferable because the diffusion of paradium into the copper film can be virtually prevented by forming the copper film after providing paradium to a thickness on the order of extremely thin mono-layer, so that a copper film having an extremely small specific resistance can be formed. In the present invention, since the first copper film formed by the electroless method serves as a base of the formation of the copper film by the electric plating method and is used as the feeder layer; the first copper film has much smaller specific resistance than the metal such as a barrier metal layer or the like, and the copper film having sufficiently small specific resistance can be formed. Thus, problems are not often generated even if the paradium is not necessarily formed in a thickness on the order of the mono-layer.

However, it is preferable that when the paradium film is formed in thinner thickness, because the paradium can be suppressed to diffuse into the copper film. Thus, it is also preferable that the paradium film is formed in the mono-layer. The paradium film is formed in a thin layer by controlling the immersion time of the substrate in the $Pd^{2+}$ solution as described above. A thin layer of the paradium film can be formed with certitude by forming the tin film in a thickness on the order of the mono-layer. From that point of view, preferably the tin film can be formed by the adsorption method in which the substrate is immersed in the $Sn^{2+}$ solution so that the thin tin film can be formed in a thin thickness on the order of the mono-layer according to the characteristic of $Sn^{2+}$.

Furthermore, in the above embodiment, there is shown a case in which a wiring is formed which contacts with a semiconductor layer. In the semiconductor device in which a multiple layer wiring is formed, such device is the same as the above embodiment, in that a wiring which contacts with a lower layer wiring in the case where an upper layer wiring is formed on the lower layer wiring. Incidentally, even if no barrier metal layer is formed, the tin film can be formed with adsorption, so that the semiconductor device can be formed in the same process.

According to the second embodiment, since the copper film wiring having an extremely small specific resistance can be formed with the electric plating method, the electric resistance of the wiring can be further lowered with the result that even in the case in which much highly integrated, fine and thin wiring is demanded, the wiring provided in the semiconductor device can be formed without increasing the resistance. As a result, such process further contributes toward the higher integration of the semiconductor device and the formation of the multiple layer wiring.

FIG. 3(a) through 3(d) are cross section explanatory views showing a process for forming a wiring of a third embodiment according to the present invention. In the embodiment shown in FIGS. 3(a) through 3(d), there is shown an embodiment in which the insulting film 2 is formed of three layers comprising a first insulting film to a third insulting film. In the beginning, for example, the first insulting film 21 made of SiO*hd x* and a second insulting film 22 made of $SiN_x$ are formed and a contact hole 2a is further formed. Then, a third insulting film 23 made of $SiO_x$ is further formed thereon, and a resist film 8 is formed on the surface thereof. Then, the resist film 8 is patterned to form the contact hole 2a and a portion of a groove portion 2b for wiring formation. As shown in FIG. 3(a), the third insulting film 23 is etched to expose the semiconductor substrate 1 in the contact hole 2a portion, and, at the same time, a groove 2b for the formation of the wiring is formed. A method for forming this insulting film 2 in three layers, followed by temporarily forming the contact hole 2a, and providing the third insulting film 23 again is one of the methods which is conventionally used in the case where the wiring is formed in the groove 2b for wiring provided on the insulting film 2. Other methods can be used.

As the semiconductor substrate 1, in the same manner as the embodiment described above, for example, a silicon substrate or the like is used, and the conductivity type is formed in an n-type or a p-type depending upon the semiconductor element which is formed. Furthermore, as the insulting films 21 through 23, by providing a lamination layer of material having different etching rates such as a combination of $SiO_x$ and $SiN_x$ or the like which is used in the manufacturing process of the normal semiconductor device, the groove 2b for wiring can be easily formed with good precision of the depth thereof. Furthermore, the diffusion of copper can be prevented by using $SiN_x$, and the influence on the semiconductor layer can be eliminated even when the barrier metal is not used.

Figure 3:
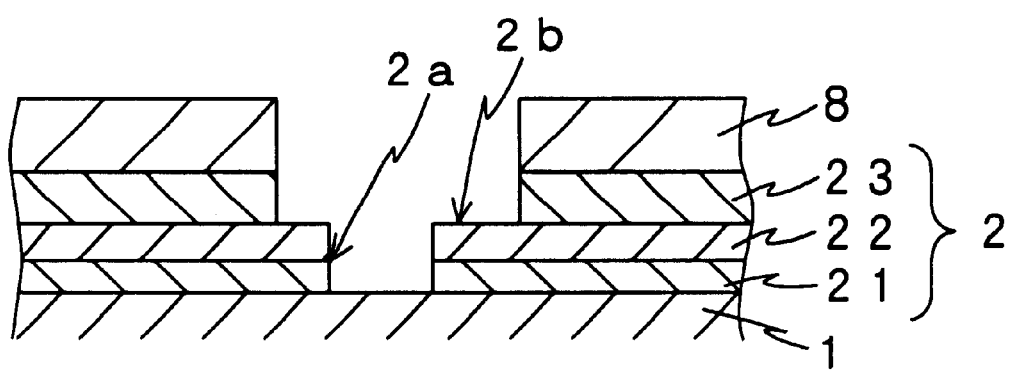
FIGS. 3(a) through 3(d) are views showing a wiring formation process, the view explaining still another embodiment of the method for manufacturing the semiconductor device according to the present invention.
Figure 3:
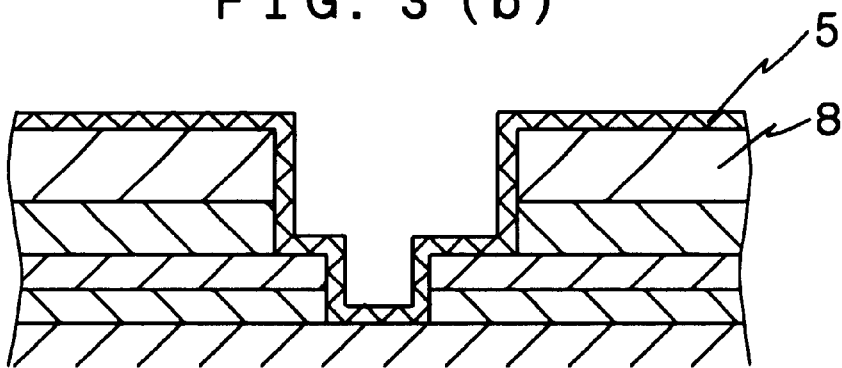
Figure 3:
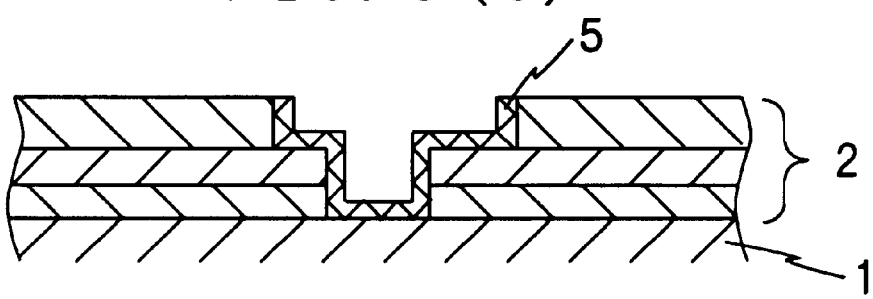
Figure 3:
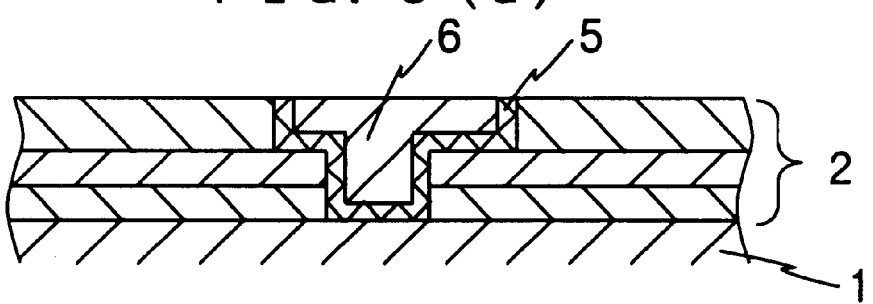

Next, as shown in FIG. 3(*b*), after the tin film (not shown) is formed in an extremely thin thickness in the same manner as embodiment 1, the paradium film 5 can be formed to an extent of mono-layer by immersing the tin film in a solution containing a paradium ion ($Pd^{2+}$). The method for forming the tin film and the paradium film at this time, and the solution containing a tin ion and the solution containing a paradium ion are the same as the first embodiment.

Next, the resist film 8 is removed with an oxygen plasma or a solution. At this time, tin deposited on the resist film 8 and paradium which is replaced with tin are removed together. As shown in FIG. 3(*c*), there is provided a structure in which a thin paradium film 5 is formed on the contact hole 2a and the groove 2b for wiring.

Next, as shown in FIG. 3(*d*), copper is plated on only on the contact hole and the portion for wiring by providing electroless plating by using a plating solution containing copper ion and using the paradium film 5 as a reaction start layer with the result that the copper film 5 can be formed on the surface of the paradium. A plating solution containing a copper ion in this case is the same as the first embodiment.

In the method for manufacturing the semiconductor device according the third embodiment, a resist film is used for patterning the insulting film at a location where the wiring is formed. The resist film is used as it is, and the reaction start layer is patterned. Then, the reaction start layer is used as a seed to form the copper film by the electroless plating method, so that copper is not formed on a portion where the reaction start layer is not present. In the one time mask pattern, the insulting film is etched, and the copper wiring can be formed in a desired configuration. As a consequence, no shift in the mask is generated, and fine wiring can be formed in a minimum width, thereby contributing toward the higher density.

Furthermore, the reaction start layer is formed as an extremely thin film on the order of mono-layer by the replacement with tin with a paradium ion solution with the result that constituting elements of the reaction start layer is not diffused in the copper film at the time of forming copper by the electroless plating. Thus, the copper film having an extremely low resistance can be formed without raising the resistance of the copper. As a consequence, the wiring can be made extremely thin, thereby contributing further toward the higher integration.

According to the third embodiment, the wiring having an extremely low resistance can be formed in extremely precise pattern, so that a margin of the shift in the mask is not required to be taken and extremely fine wiring pattern can be formed. Besides, patterning for forming the groove for the wiring and patterning of the wiring can be conducted in one time patterning process, and the number of process can be decreased. As a consequence, a semiconductor device having a highly integrated fine wiring pattern can be obtained which has been remarkably advanced in recent years.

Although preferred example have been described in some detail it is to be understood that certain changes can be made by those skilled in the art without departing from the spirit and scope of the invention as defined by the appended claims.

What is claimed is:

1. A method for manufacturing a semiconductor device wherein a contact hole is provided on an insulating film on a substrate to be connected to an exposed portion by said contact hole, and a wiring is formed on said insulating film, the method comprising the steps of:

forming a tin film on a location where said wiring is formed;

forming a paradium film on the surface of said tin film by immersing the location where said tin film is formed in a solution containing a paradium ion; and forming a copper film by the electroless plating method by using the paradium film as a reaction start layer.

2. The method for manufacturing the semiconductor device of claim 1, wherein said tin film is formed on said location where said wiring is formed by immersing said location where the wiring is formed in a solution containing a tin ion to adsorb the tin.

3. The method for manufacturing the semiconductor of claim 1, wherein said paradium film is formed in a monolayer.

4. The method for manufacturing the semiconductor of claim 1, wherein said copper film formed by the electroless plating method is set as a first copper film, and a second copper film is formed on said first copper film by an electroplating method by using said first copper film as a feeder layer.

5. A method for manufacturing a semiconductor device wherein a contact hole is provided on an insulating film on a substrate and a part of the insulating film on a location for forming a wiring is etched to form a groove for said wiring, and said wiring is formed on said insulating film so as to be connected to an exposed portion by said contact hole, the method comprising the steps of:

providing and patterning a resist film on said insulating film and forming said contact hole and said groove for said wiring by etching said insulating film;

forming a reaction start layer for a copper electroless plating on an entire surface of said resist film and an exposed surface by said etching, wherein said reaction start layer is formed by the steps comprising: forming a tin film, and forming a paradium film on the surface of said tin film by immersing a portion where said tin film is formed in a solution containing a paradium ion;

retaining the reaction start layer only on the location for forming the wiring by removing the reaction start layer on said resist film together with said resist film; and forming a copper film on said reaction start layer by an electroless plating method.

6. The method for manufacturing the semiconductor device of claim 5, wherein said tin film is formed by immersing said substrate on which said contact hole and said groove for said wiring are formed in a solution containing a tin ion.

* * * * *